United States Patent [19]

Takaoka

[11] 3,798,550

[45] Mar. 19, 1974

[54] FM RECEIVER

[75] Inventor: Saburo Takaoka, Tokyo, Japan

[73] Assignee: Pioneer Electronic Corporation, Tokyo, Japan

[22] Filed: Dec. 8, 1972

[21] Appl. No.: 313,210

[30] Foreign Application Priority Data

Dec. 8, 1971 Japan ............................ 46-099270

[52] U.S. Cl. .................. 325/346, 325/351, 325/476

[51] Int. Cl. ............................................ H04b 1/06

[58] Field of Search ............ 179/15 BT; 325/45, 48, 325/344–346, 349, 351, 419–423, 433, 476, 347, 348; 329/122, 136; 333/15, 16

[56] References Cited

UNITED STATES PATENTS 3,111,625 11/1963 Crafts ............................... 325/346

*Primary Examiner*—Albert J. Mayer

*Attorney, Agent, or Firm*—Sughrue, Rothwell, Mion, Zinn & Macpeak

[57] ABSTRACT

A portion of a demodulated signal derived from a demodulator circuit, in an FM receiver having a phase locked loop to generate a subcarrier, is phase-inverted and applied to counterbalance demodulation components generated by a phase comparator circuit of the phase locked loop.

3 Claims, 2 Drawing Figures

FM RECEIVER

BACKGROUND OF THE INVENTION

1. Field of the Invention

This invention relates to an FM (frequency modulation) receiver and, more particularly, to a demodulator section of the FM receiver employing a phase controlled loop or phase locked loop in a sub-carrier generating circuit.

2. Description of the Prior Art

In the prior art, a sub-carrier generating circuit in a demodulator section of an FM receiver generally comprises an L-C resonant tank or mechanical resonator. However, it was necessary to minimize the variation of the tuned frequency relative to temperature variation for the resonance elements. The establishment of the "Q" of coils was very difficult and provided obstacles in recently developed manufacturing processes using integrated circuit techniques. It was necessary to give undue consideration and attention to the manufacturing of resonance elements to obtain stability and reliability.

Recently, a sub-carrier generating circuit has been developed which employs a phase controlled loop or phase locked loop adapted for manufacture as an integrated circuit, without employing the afore-mentioned L-C resonant tank or mechanical resonator. The phase locked loop is designed so that it compares a comparison signal (19 KHz) derived from a voltage controlled oscillator with a pilot signal (19 KHz) which is part of a composite FM signal, to generate an error voltage corresponding to a phase difference obtained by the comparison operation. The error voltage controls the oscillation signal of the voltage controlled oscillator to coincide in phase with the signal input the phase locked loop.

However, because the foregoing phase locked loop was employed directly in the sub-carrier generating circuit in the prior art, distortion occurs and there is a decrease in the degree of channel separation in a demodulated signal when the signal is modulated by low frequency components of the sub-carrier. Such distortion and decrease in the degree of channel separation in the demodulated output signal is caused by jitter appearing in the output of the voltage controlled oscillator, which in turn is the result of demodulated signal components appearing in the output of the phase comparator circuit, because of insufficient linearity of the phase comparator circuit comprising the phase locked loop, distortion of the comparison signal of 19 KHz and the like.

SUMMARY OF THE INVENTION

Therefore, it is an object of the present invention to overcome the foregoing drawbacks of the prior art.

It is another object of the present invention to provide an FM receiver employing a phase controlled loop or phase locked loop miniaturizable and suitable for manufacture in the integrated circuit form.

It is a further object of the present invention to provide an FM receiver including a sub-carrier generating circuit utilizing a phase locked loop with reduced distortion and improved selectivity of a demodulated output signal.

According to the present invention an improved FM receiver is provided, which employs a phase locked loop to generate a sub-carrier. The present invention is characterized by a phase inverter circuit which is employed to counterbalance demodulation components generated by a phase comparator circuit of the phase locked loop.

More specifically, in the FM receiver including a demodulator circuit and a sub-carrier generating circuit comprising a voltage controlled oscillator for generating a sub-carrier, a phase comparator circuit compares the phases of a comparison signal derived from the voltage controlled oscillator and a pilot signal which is part of an FM composite signal. A low pass filter rejects main and subcarrier signal components from an error voltage representative of the phase difference obtained by the phase comparator circuit, and a DC amplifier amplifies the filtered error voltage to phase-control the voltage controlled oscillator. A phase inverter circuit is connected from the output of the demodulator circuit of the FM receiver to the input of the low pass filter which also receives the output of the phase comparator circuit to reduce distortion of the demodulated output signal and improve the selectivity thereof.

DESCRIPTION OF THE PREFERRED EMBODIMENT

Figure 1:
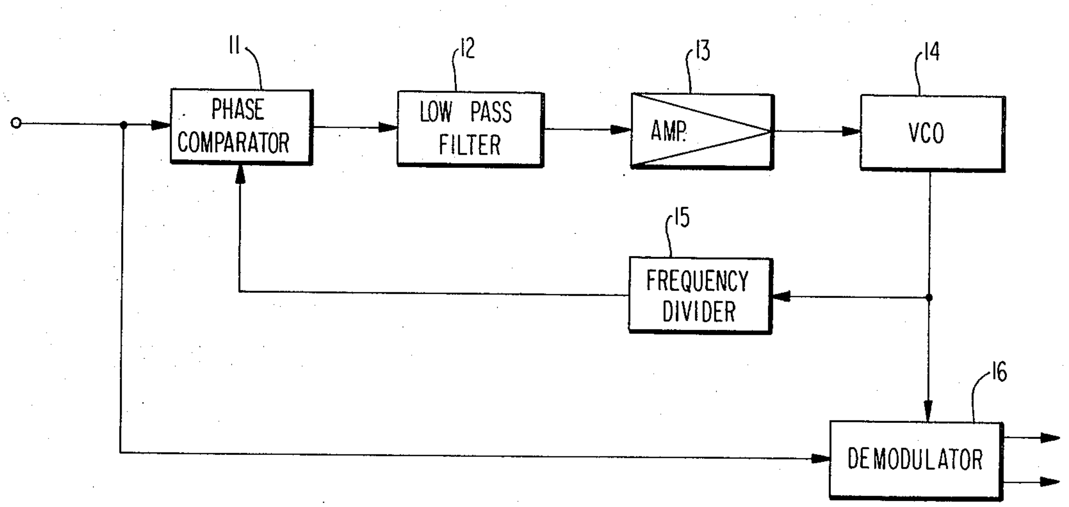
FIG. 1 is a block diagram of a demodulator section of an FM receiver utilizing a phase locked loop of the prior art.

Before describing a preferred embodiment of the present invention, a reference is made to FIG. 1 showing block form a sub-carrier generating circuit utilizing a phase controlled loop or phase locked loop of the prior art in order to facilitate clear understanding of the background of the present invention.

In FIG. 1, an oscillation signal (having a frequency of, for example, 38 KHz) generated by a voltage controlled oscillator 14 is applied to a demodulator circuit 16 where it is used as a subcarrier of a receiver and, to a frequency divider 15 where it is divided by two to generate a phase comparison signal having a frequency of 19 KHz that corresponds to the frequency of the pilot signal.

The phase comparison signal, i.e., the divided-by-two oscillation signal, is supplied to a phase comparator circuit 11 where the phase comparison signal is compared with the pilot signal (19 KHz), which is a part of a composite FM signal, supplied from a tuner section (not shown) to the comparator circuit 11 and used as a reference. The comparator circuit 11 generates an error voltage representative of the thus obtained phase difference. The error voltage obtained by the phase comparator circuit 11 is applied to a low pass filter circuit 12 where main and subcarrier signal components included in the error voltage are rejected.

The filtered error voltage is amplified by a DC amplifier 13 and then used as a control signal to control the phase of the oscillation signal generated by the voltage controlled oscillator 14. As the signal representative of the phase difference between the pilot signal and the comparison signal obtained by frequency-dividing the receiver sub-carrier by two, i.e., the aforesaid control signal, is applied to the voltage controlled oscillator 14, the receiver sub-carrier generated by the voltage controlled oscillator 14 is caused to coincide in phase with the transmitter sub-carrier.

When the phase difference is zero between the pilot signal and the comparison signal obtained by frequency-dividing the sub-carrier derived from the voltage controlled oscillator 14, no error voltage is generated in the phase comparator circuit 11 and the phase of the subcarrier is locked.

As noted above, the conventional phase locked loop of FIG. 1 had the tendency of distortion and decrease in channel separation of the demodulated signal when the signal is modulated by low frequency components of the sub-carrier.

Figure 2:
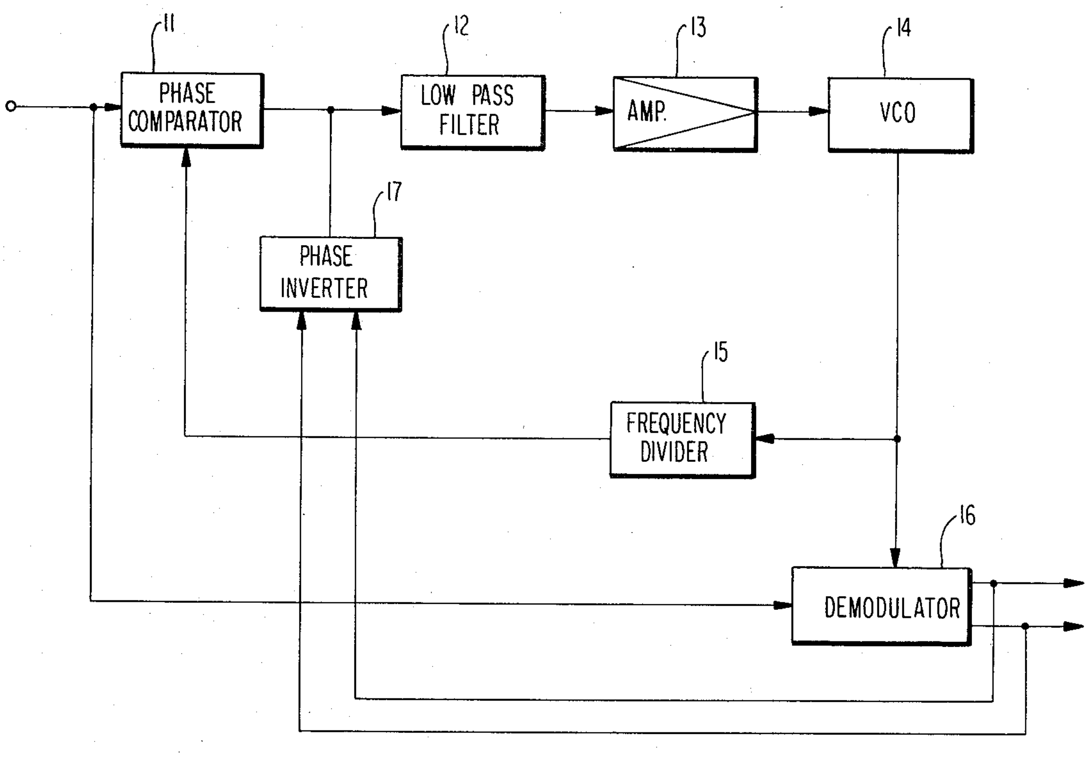
FIG. 2 is a block diagram of a demodulator section of the FM receiver utilizing the phase locked loop constructed in accordance with the present invention.

The present invention modifies the arrangement shown in FIG. 1 and includes a phase inverter circuit 17 as shown in FIG. 2. The phase inverter circuit 17 which is coupled in the conventional phase locked loop has an input connected to the output of the demodulator circuit 16 and an output coupled to a transfer line between the phase comparator circuit 11 and the low pass filter circuit 12.

It will be noted, in addition to the above-described fundamental operation in connection with the prior art device, that a demodulated signal obtained by the demodulator circuit 16 is supplied through lines to the phase inverter circuit 17. The demodulated signal, phase-inverted by the phase inverter circuit 17, is then applied to the low pass filter circuit 12 with the output of the phase comparator circuit 11, so that a demodulated signal in a low frequency range produced in the phase comparator circuit 11 is mixed with the phase-inverted demodulated signal and counterbalanced thereby.

As appreciated from the foregoing description, according to the present invention, the FM receiver can be miniaturized and produced in the form of integrated circuit structure. Further, the present invention improves remarkably the distortion characteristic of the demodulated output signal and the degree of channel to channel separation power, in comparison to the prior art.

Although the invention has been described with respect to the preferred embodiment thereof, it is understood by those skilled in the art that various modifications can be made in construction and arrangement within the scope of the invention as defined in the appended claims.

What is claimed is:

1. In an FM receiver including

*a.* a demodulator circuit for demodulating a composite signal with a phase locked subcarrier; and

*b.* a sub-carrier generating circuit comprising a voltage controlled oscillator for generating a sub-carrier, a phase comparator circuit for comparing the phase of a comparison signal derived from said voltage controlled oscillator to a pilot signal comprising a part of an FM composite input signal, a low pass filter for rejecting obstacle signal components from an error voltage representative of the phase difference obtained by said phase comparator circuit, and a DC amplifier for amplifying the filtered error voltage to phase control said voltage controlled oscillator;

the improvement comprising phase inverter means having its input connected to said demodulator circuit and its output connected to said low pass filter for receiving a portion of the demodulated signal derived from said demodulator circuit, phase inverting said portion and applying said inverted portion to an input of said low pass filter to counterbalance demodulation components generated by said phase comparator circuit.

2. An FM receiver as set forth in claim 1 wherein the comparison signal is derived by a frequency divider from the output of said voltage controlled oscillator.

3. In a method of demodulating a composite FM signal including a pilot signal comprising the steps of

*a.* generating a sub-carrier signal;

*b.* comparing the phase of said sub-carrier with the phase of said pilot signal;

*c.* generating an error signal in accordance with said comparison;

*d.* controlling the phase of said sub-carrier in accordance with said error signal to phase lock said sub-carrier and said pilot signal;

*e.* demodulating said composite signal with said phase locked sub-carrier;

the improvement comprising:

phase inverting a portion of the demodulated signal and mixing said phase inverted portion with said comparison signal to counterbalance demodulation components in said comparison signal.

* * * * *